(12) United States Patent
Lee et al.

(10) Patent No.: US 6,656,823 B2
(45) Date of Patent: Dec. 2, 2003

(54) SEMICONDUCTOR DEVICE WITH SCHOTTKY CONTACT AND METHOD FOR FORMING THE SAME

(75) Inventors: Suk Hun Lee, Taegu (KR); Yong Hyun Lee, Taegu (KR); Jung Hee Lee, Taegu (KR); Sung Ho Hahm, Taegu (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/809,163

(22) Filed: Mar. 16, 2001

(65) Prior Publication Data

US 2001/0034116 A1 Oct. 25, 2001

(30) Foreign Application Priority Data

Mar. 22, 2000 (KR) .......................................... 2000-14564

(51) Int. Cl.[7] .............................................. H01L 21/28
(52) U.S. Cl. ........................ 438/575; 438/580; 438/583
(58) Field of Search ................................. 438/575, 580, 438/583; 257/192, 193, 194, 195

(56) References Cited

U.S. PATENT DOCUMENTS 4,626,322 A * 12/1986 Switzer ................. 204/DIG. 3
5,619,393 A * 4/1997 Summerfelt et al. ........ 29/25.42
6,045,626 A * 4/2000 Yano et al. .................. 117/950
6,100,174 A * 8/2000 Takatani ...................... 438/605

OTHER PUBLICATIONS

Lee et al. "RuO2/GaN Schottky Contact Formation with Superior Forward and Reverse Characteristics" pp. 261–263 IEEE Electron Device Letters, vol. 21 No. 6, Jun. 2000.*

* cited by examiner

*Primary Examiner*—George Fourson
*Assistant Examiner*—Fernando Toledo
(74) *Attorney, Agent, or Firm*—Fleshner & Kim, LLP (57) ABSTRACT

Method for forming a Schottky contact in a semiconductor device includes a step of preparing an n type GaN group compound semiconductor layer, such as $Al_xGa_{1-x}N$ and $In_xGa_{1-x}N$. At least one metal layer including a ruthenium component layer is formed on the n type GaN group compound semiconductor layer as a rectifying junction metal. The rectifying junction metal may be used as a gate of a field effect transistor, or an electrode of a Schottky diode. The ruthenium oxide has a low cost, is stable to heat and chemical, and has excellent electric characteristics. The application of the ruthenium oxide to the rectifying junction metal enhances performances, such as UV ray detection, of electronic devices and optical devices operable at an elevated temperature.

25 Claims, 9 Drawing Sheets

SEMICONDUCTOR DEVICE WITH SCHOTTKY CONTACT AND METHOD FOR FORMING THE SAME

BACKGROUND OF THE INVENTION

1. Field of the Invention

The present invention relates to a semiconductor device with a Schottky contact, and a method for forming a Schottky contact in a semiconductor device.

2. Background of the Related Art

Recently, GaN group compound semiconductors are widely used in semiconductor devices, such as field effect transistors and diodes. For an example, in fabrication of related art GaN group field effect transistors, for rectifying junction of a gate electrode, either single metal, such as Pt, Pd, Au, Ni, or multi-layer of metals, such as Au/Ni, Au/Pt are used. In order to form a rectifying metal junction on an undoped GaN thin film and an 'n' type GaN thin film, the single metal or the multi-layer of metals are used widely. Of the metals, Pt forms the most excellent rectifying junction on the GaN thin film. Pt also has a high melting point, an excellent chemical resistance, as well as a high work function of approx. 5.65 eV. Moreover, Pt forms a junction potential barrier of a height approx. 1.20~1.27 eV at junction with the GaN thin film. Besides the GaN, ternary compounds, such as AlGaN and InGaN, are stable to heat and chemical, and have an excellent physical strength. The ternary compounds are materials the most suitable for blue and green light emitting devices and UV ray detecting devices as the ternary compounds have an energy gap in a range of 1.9~6.2 eV. As explained, those GaN group compound semiconductors, of which study is started for development of the blue light emitting devices, has, not only a high saturated electron velocity, a high breakdown voltage, and a high thermal conductivity, but also a high two dimensional electron concentration, and a high electron mobility owing to a great difference of conduction band energies when a hetero-junction of AlGaN/GaN is formed. Accordingly, there have been many researches on the GaN group compound semiconductors for application to electronic devices, recently. Of the electronic devices and the optical devices of the GaN group compound semiconductors, devices of MESFET, HFET and UV detectors are under research the most actively. As results of the researches, performances of the devices are excellent close to levels to put into practical use. In fabrication of the field effect transistors, since a gate rectifying junction gives a great influence to device characteristics, there are many reports on researches for improving the characteristics.

However, the foregoing related art method for forming a Schottky contact has the following problems.

In fabrication of electronic devices of field effect transistors having excellent operational characteristics at an elevated temperature, the rectifying junctions are formed by using the GaN group compound semiconductors and metals, such as Pt, used presently. The GaN group compound semiconductors and the metals inclusive of Pt show significantly poor characteristics at an elevated temperature. Therefore, it is difficult to fabricate high powered devices for operation at an elevated temperature, of metals currently used the mostly, inclusive of the GaN group compound semiconductors and Pt.

SUMMARY OF THE INVENTION

Accordingly, the present invention is directed to a semiconductor device with a Schottky contact, and a method for forming a Schottky contact in a semiconductor device that substantially obviates one or more of the problems due to limitations and disadvantages of the related art.

An object of the present invention is to provide a method for forming a Schottky contact in a semiconductor device, which permits fabrication of a high powered semiconductor device operable at an elevated temperature.

Another object of the present invention is to provide a method for forming a Schottky contact in a semiconductor device, which permits to obtain a rectifying junction having an excellent thermal characteristic, chemical characteristic, and an electrical characteristic.

Further object of the present invention is to provide a semiconductor device having an excellent Schottky contact.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

The present invention is characterized in that ruthenium and ruthenium oxides are employed as a rectifying junction metal of a GaN group compound semiconductor. The ruthenium and ruthenium oxides are favorable for fabrication of high powered devices operable at an elevated temperature owing to excellent electrical characteristics and stable to heat and chemical.

To achieve these and other advantages and in accordance with the purpose of the present invention, as embodied and broadly described, at first an n type GaN group compound semiconductor layer is prepared. Then, at least one metal layer including a ruthenium component layer as a rectifying junction metal is formed on the n type GaN group compound semiconductor layer.

Preferably, the rectifying junction metal including the ruthenium component layer may be any one selected from $RuO_2$, Ru, $RuO_2$/Ru, Ru/$RuO_2$, Au/$RuO_2$, Au/Ru, Au/$RuO_2$/Ru, and Au/Ru/$Ru_{O2}$.

Preferably, an upper layer of the rectifying junction metal including the ruthenium component layer is formed of any one material selected from $RuO_2$, Ru, $RuO_2$/Ru, and Ru/$RuO_2$, and a lower layer thereof is formed of at least one layer of a material selected from Pt, Pd, Ni, Au, Al, W, WSi, Zn, Ta, Ti, Co, and In.

Preferably, the at least one layer of rectifying junction metal including ruthenium or ruthenium oxide may be heat treated at an elevated temperature ranging 300° C.–600° C. under an ambient of at least one gas selected from oxygen, nitrogen, argon, and air, or of a mixed gas, or of a vacuum, or may not be heat treated.

In fabrication of electronic devices and optical devices, ruthenium or a ruthenium oxide is employed as a rectifying junction meta. The ruthenium and ruthenium oxides have a low cost, are stable to heat and chemicals, and have excellent electric characteristics, thereby improving a high temperature performance and an UV ray detection performance of the semiconductor devices, such as the electronic devices and the optical devices.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. According to a method for forming a Schottky contact in a semiconductor device, an 'n' type GaN group compound semiconductor layer is provided, at first. Then, at least one metal layer, inclusive of a ruthenium component layer as a rectifying junction metal is formed on the 'n' type GaN group compound semiconductor layer. The 'n' type GaN group compound semiconductor layer may be either an 'n' type GaN or an 'n' type $Al_xGa_{1-x}N$, where 'x' is $0 \leq x \leq 0.5$. The rectifying junction metal may be Ru or Ru oxide inclusive of RuO, $RuO_2$, $RuO_4$, and $RuO_5$ as a single metal layer, or $Au/RuO_2$, Au/Ru, $RuO_2/Ru$, or $Ru/RuO_2$ as double layered metal layer, or $Au/RuO_2/Ru$ or $Au/Ru/RuO_2$ as triple layered metal layer. The rectifying junction metal is heat treated at a temperature ranging 400° C.–600° C. under a gaseous ambient of at least one of oxygen, nitrogen, argon, and air, or vacuum. The semiconductor device includes metal-semiconductor transistors and Schottky diodes inclusive of the AlGaN/GaN HFET. The rectifying junction may include a doubled layer of an upper layer and a lower layer. The upper layer of the rectifying junction metal may be formed of one selected from $RuO_2$, Ru, $RuO_2/Ru$, and $Ru/RuO_2$, and the lower layer of the rectifying junction metal may be formed of one selected from Pt, Pd, Ni, Au, Al, W, WSi, Zn, Ta, Ti, Co, and In. The rectifying junction metal may be heat treated at a temperature ranging 400° C.–600° C. under a gaseous ambient of at least one of oxygen, nitrogen, argon, and air, or vacuum, for improving junction characteristic. For suppressing characteristics of the metal of the lower layer of the rectifying junction metal layer, it is preferable to form the lower layer at a thickness thinner than 200 Å. The semiconductor device may include metal-semiconductor transistors inclusive of AlGaN/GaN HFET, and Schottky diodes. The ruthenium, a metal in a same group with Pt, Pd, and Ni, has a low cost, a high melting point (2310° C.), and stable to chemical compared to Pt which is used the most widely as the rectifying junction metal of a GaN group compound semiconductor, presently. The ruthenium oxide has a crystalline structure of tetragonal rutile, an electrical conductivity identical to a metal, stable to heat, and chemical, and is mostly used as a diffusion barrier layer of a memory, presently. In a case when the ruthenium oxide $RuO_2$ is used as the rectifying junction metal of the GaN group compound semiconductor, the ruthenium oxide $RuO_2$ provides a junction potential barrier of approx. 1.47 eV, which is the highest of all the reports up to now, and has a reverse breakdown voltage higher than Pt as a reverse direction leakage current of the ruthenium oxide $RuO_2$ is smaller than Pt by approx. $10^2$~$10^3$ times.

As one of ruthenium oxides, the ruthenium oxide is employed at the rectifying junction metal of the GaN group compound semiconductor.

At first, for deposition of the ruthenium oxide, a RF magnetron sputter is employed. That is, the ruthenium is sputtered in an oxygen ambient, or ruthenium oxide target is sputtered, for deposition of ruthenium oxide. When the ruthenium oxide is sputtered, the ruthenium oxide includes different phases of oxides of RuO, $RuO_2$, $RuO_4$, $RuO_5$, and the like, of which it is known that the $RuO_2$ has the most stable phase. When the ruthenium oxides of the different phases deposited by sputtering are subjected to heat treatment, the ruthenium oxides are involved in phase changes into $RuO_2$, when the ruthenium oxide $RuO_2$ provides the best rectifying junction with the GaN group compound semiconductor.

Figure 1:
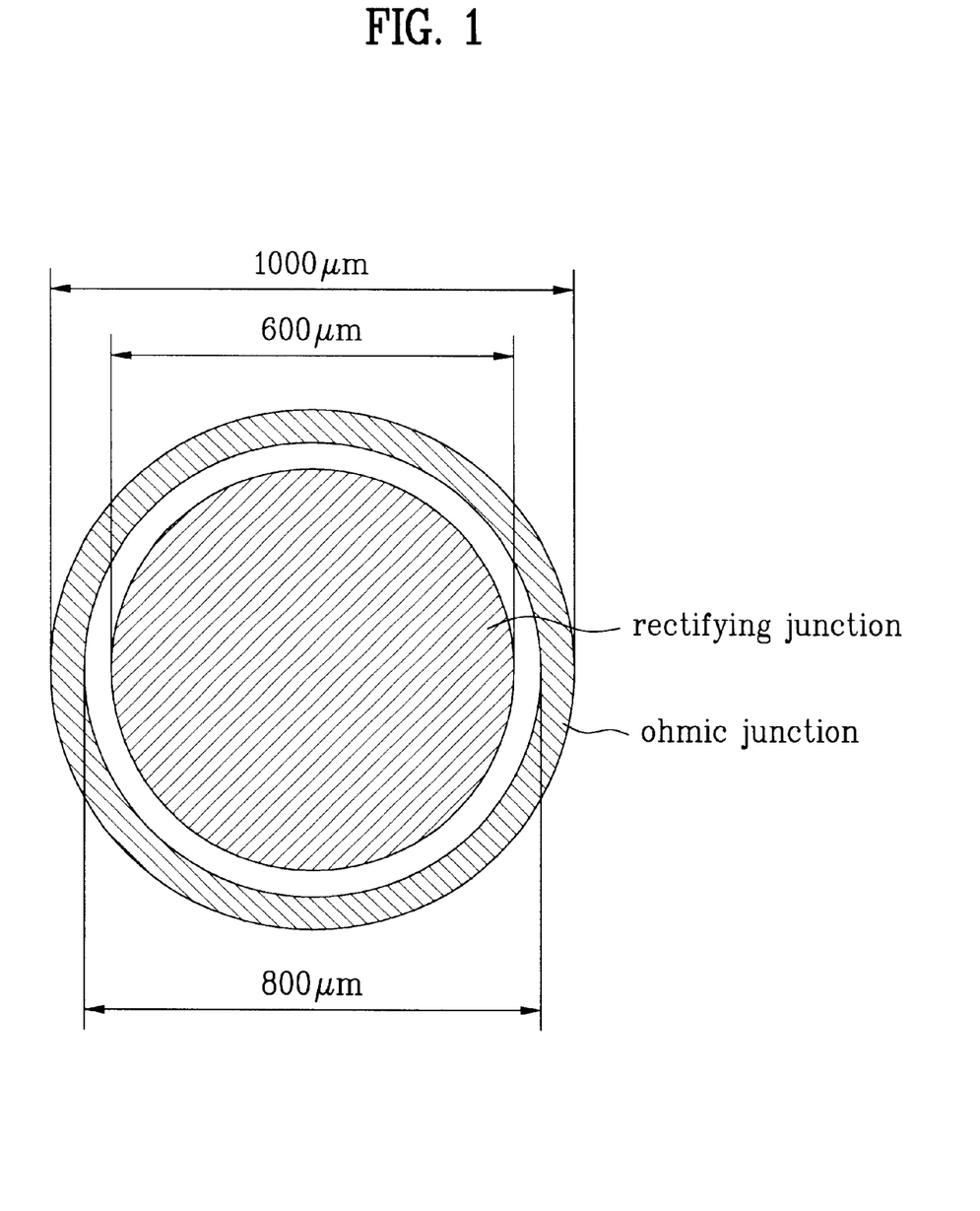
FIG. 1 illustrates a diagram showing a section of a GaN rectifying junction diode.

FIG. 1 illustrates a diagram showing a section of a GaN rectifying junction diode.

Referring to FIG. 1, the inner circle represents a rectifying junction with a 600 μm diameter, and the outer circle is an ohmic contact with a 100 μm width. GaN having the rectifying junction and the ohmic contact is grown on a sapphire substrate to a 2 μm thickness by MOCVD. An electronic mobility and an electronic concentration (background carrier concentration) are 150 cm²/V·s and $6 \times 10^{16}$/cm³. For comparing and analyzing characteristics of the ruthenium oxide, a diode is fabricated by employing Pt, which has the most excellent characteristics up to now, as the rectifying junction metal. $RuO_2$ is RF sputtered to 400 Å, and Pt is deposited to 400 Å by an E-beam evaporator. A 1000 Å thick Au is deposited on the rectifying junction of the $RuO_2$ and Pt to protect the thin $RuO_2$ and Pt. A 4000 Å thick Al is employed as the ohmic contact metal. Characteristics of the diode of $RuO_2$ and the diode of Pt, both are fabricated for examining an effect of the heat treatment, are analyzed, and subjected to heat treatment at 500° C. for 30 min. in a nitrogen ambient and analyzed, again.

FIGS. 2A~2D illustrate graphs each showing linear current vs. voltage characteristic before and after heat treatment of $RuO_2$ and Pt diodes. The Pt is heat treated, not because the Pt is involved in characteristics improvement when heat treated, but because for examining characteristics of the Pt at an elevated temperature.

Figure 2A:
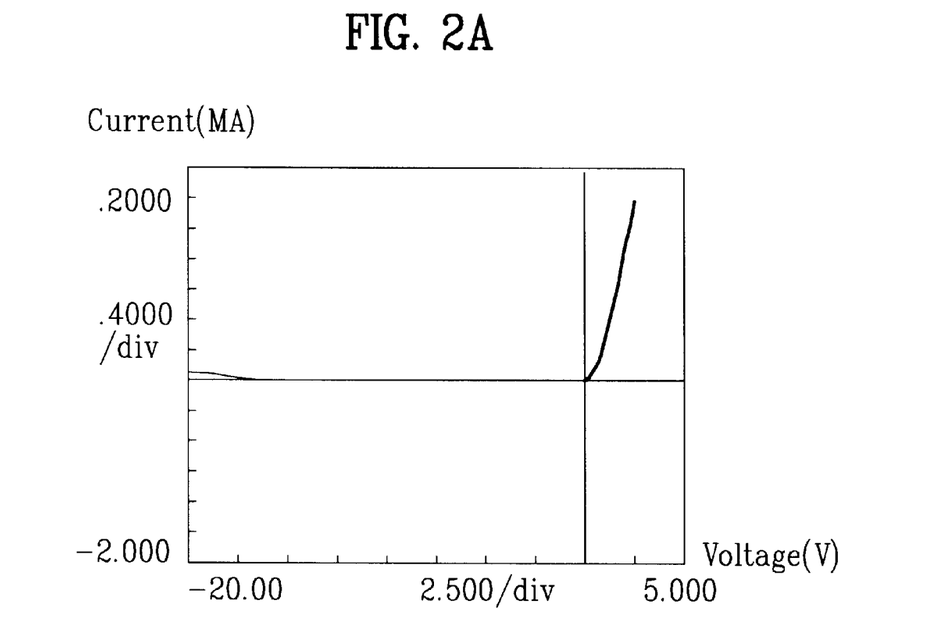
FIGS. 2A~2D illustrate graphs each showing current vs. voltage characteristic before and after heat treatment of $RuO_2$ and Pt diodes.
Figure 2B:
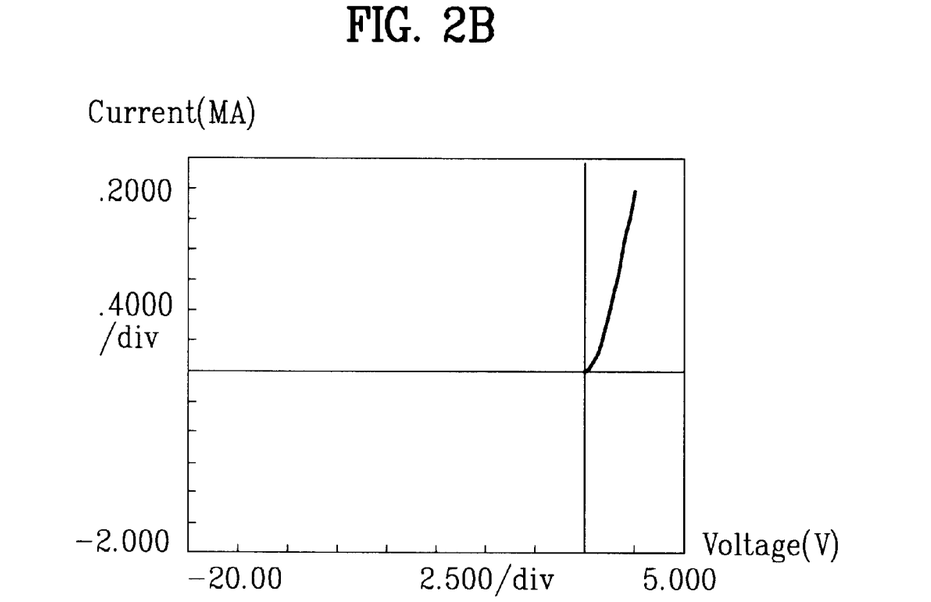
Figure 2C:
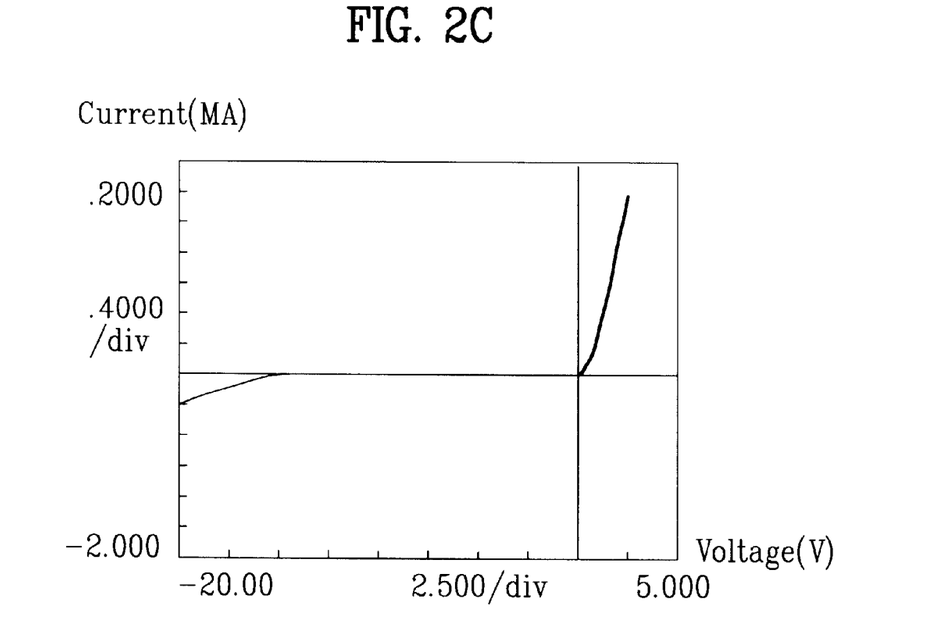
Figure 2D:
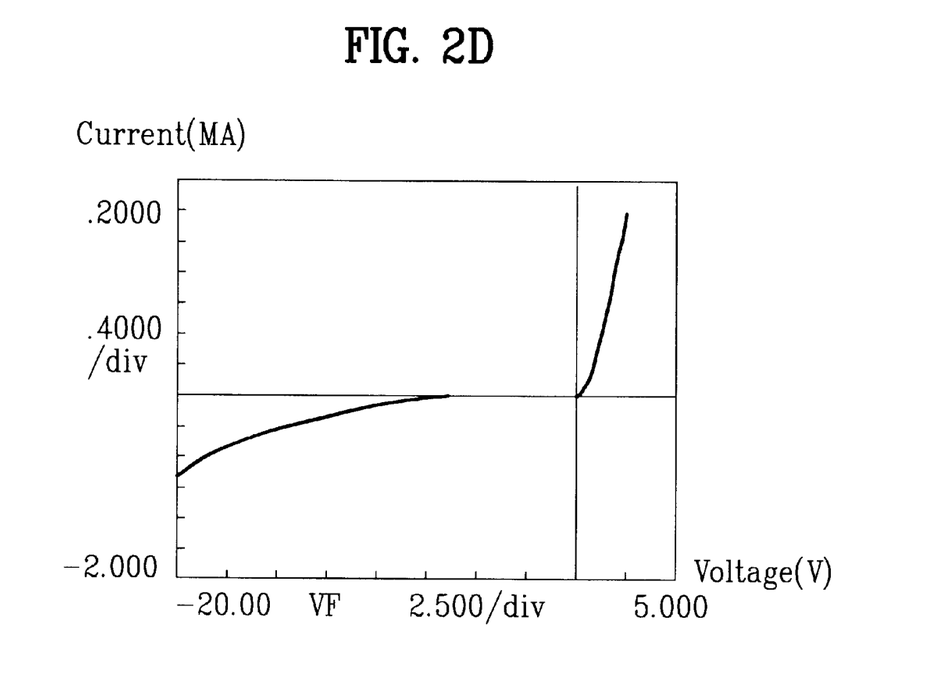

With regard to the Pt diode, the Pt diode shows 82.6 μA leakage current when −20V reverse current is applied before the heat treatment as shown in FIG. 2C, and the Pt diode shows 987.8 μA leakage current when the same −20V reverse current is applied after the heat treatment as shown in FIG. 2D. Contrary to this, with regard to the $RuO_2$ diode, the $RuO_2$ diode shows 48.5 μA leakage current when −20V reverse current is applied before the heat treatment as shown in FIG. 2A, and the $RuO_2$ diode shows 157.8 μA leakage current when the same −20V reverse current is applied after the heat treatment as shown in FIG. 2B, with a sharp improvement of characteristic.

Figure 3A:
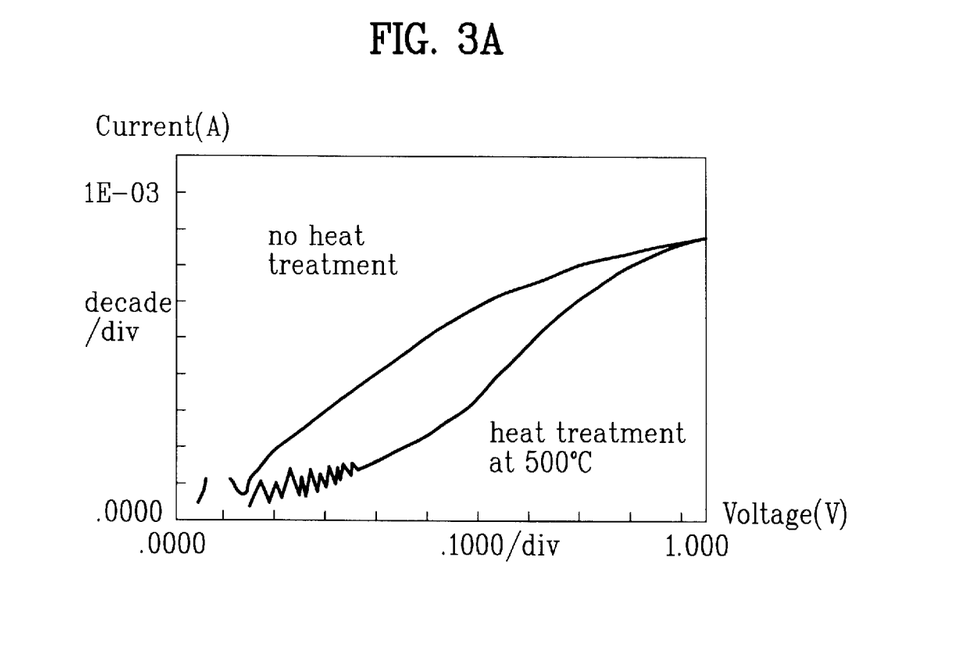
FIGS. 3A and 3B illustrate graphs each showing current vs. voltage characteristic before and after heat treatment of $RuO_2$ and Pt diodes on a semi-logarithmic coordinates.
Figure 3B:
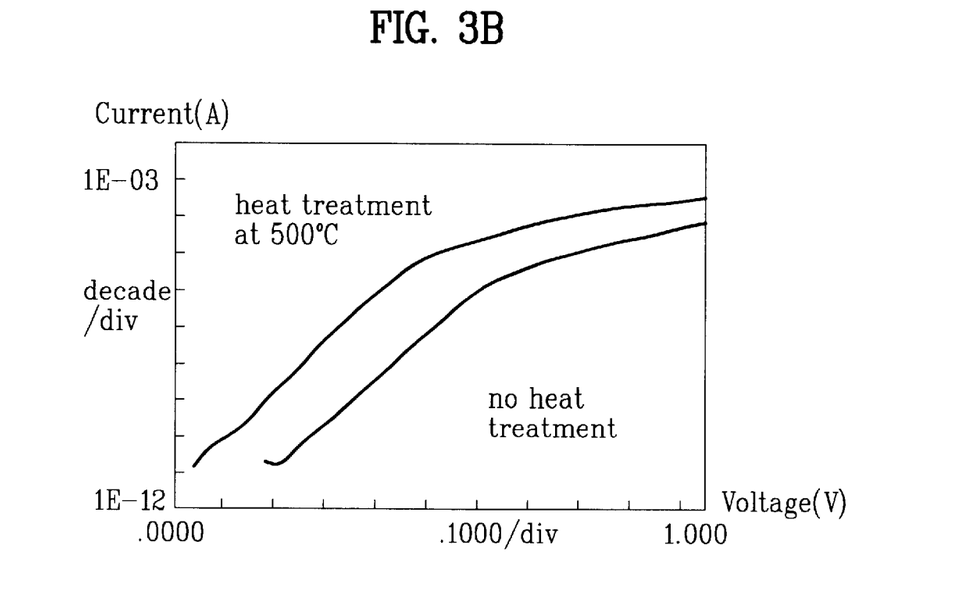
Figure 4A:
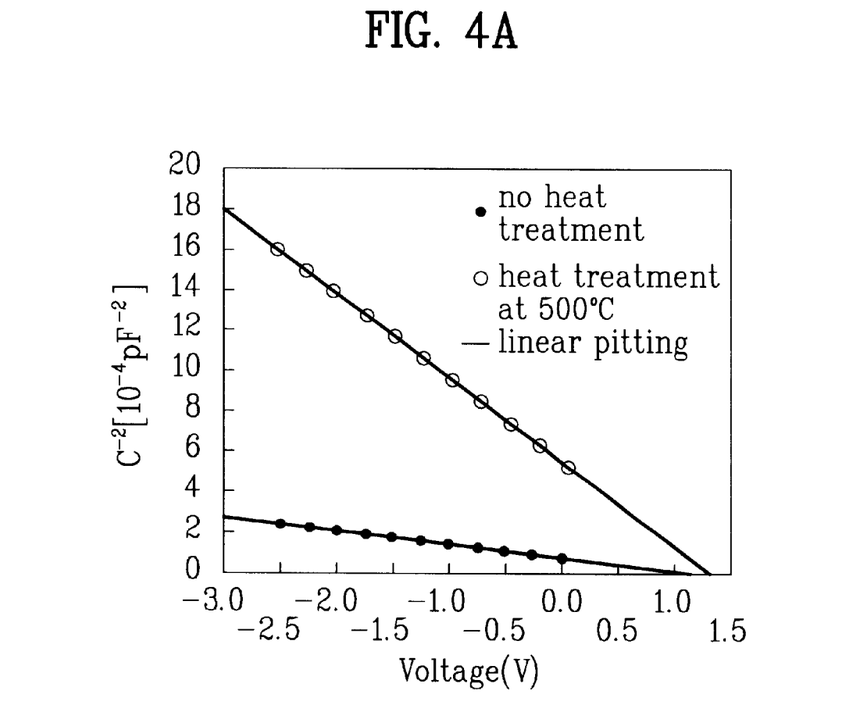
FIGS. 4A and 4B illustrate graphs each showing static capacitance vs. voltage characteristic before and after heat treatment of $RuO_2$ and Pt diodes.
Figure 4B:
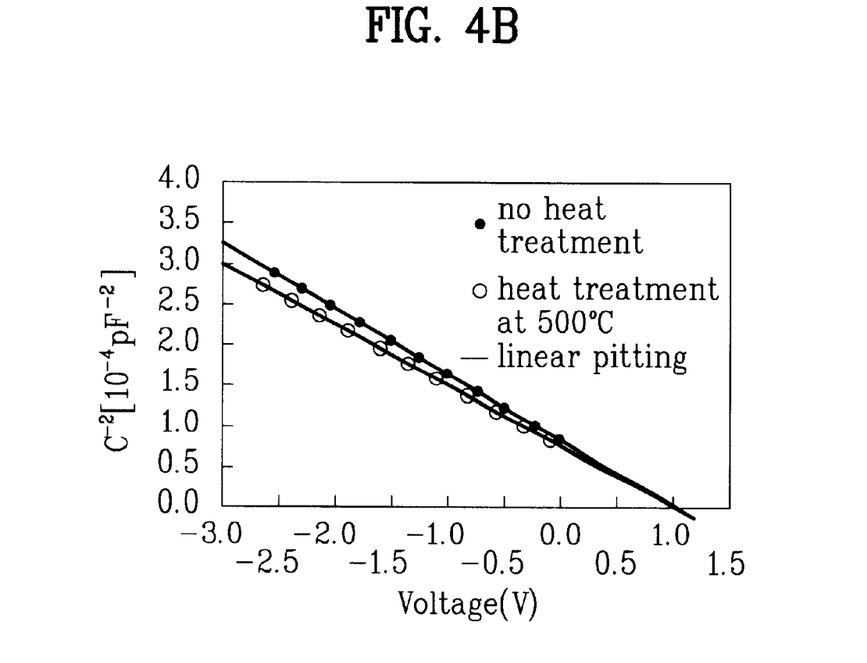

FIGS. 3A and 3B illustrate graphs each showing current vs. voltage characteristic before and after heat treatment of $RuO_2$ and Pt diodes on a semi-logarithmic coordinates, and FIGS. 4A and 4B illustrate graphs each showing static capacitance vs. voltage characteristic before and after heat treatment of $RuO_2$ and Pt diodes, as shown in table 1.

TABLE 1

| | | Pt | | $RuO_2$ | |
|---|---|---|---|---|---|
| Method | Parameter | No heat treatment | 500° C. | No heat treatment | 500° C. |
| I-V | Barrier height(eV) | 0.962 | 0.876 | 0.920 | 1.166 |
| | | (0.965)* | (0.863)* | (0.900)* | (1.145)* |
| | | (0.26)** | (0.031)** | (0.013)** | (0.019)** |
| | Ideal factor(η) | 1.420 | 1.067 | 1.363 | 1.185 |
| | | (1.543)* | (1.102)* | (1.351)* | (1.216)* |
| | | (0.109)** | (0.104)** | (0.014)** | (0.033)** |
| C-V | Barrier height(eV) | 1.075 | 1.068 | 1.038 | 1.464 |
| | Ideal factor(η) | $2.16 \times 10^{16}$ | $2.38 \times 10^{16}$ | $3.04 \times 10^{16}$ | $4.45 \times 10^{15}$ |

*denote averages of the five $RuO_2$ and Pt fabricated, respectively.
**denote standard deviations of the five $RuO_2$ and Pt fabricated, respectively.

As shown in table 1, in comparison to the sharp deterioration of characteristics of the Pt diodes, the characteristics of the $RuO_2$ diodes are enhanced, sharply. A rectifying junction potential barrier obtained from capacitance-voltage measurement C-V after the $RuO_2$ diode heat treatment is approx. 1.464 eV, which is the highest of the values known up to now, while the $RuO_2$ diode shows a smaller value of a reverse direction current of $10^2 \sim 10^3$ times of the Pt diode. Moreover, a concentration of ionized impurities at an interface of metal junction is reduced to 10 times.

Figure 5A:
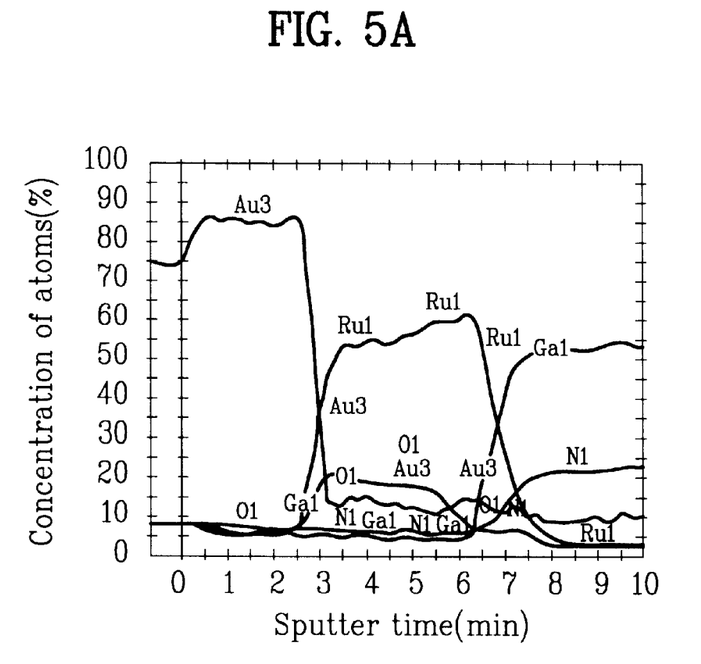
FIGS. 5A and 5B illustrate graphs each showing a result of an AES analysis before and after heat treatment of $RuO_2$ diodes.
Figure 5B:
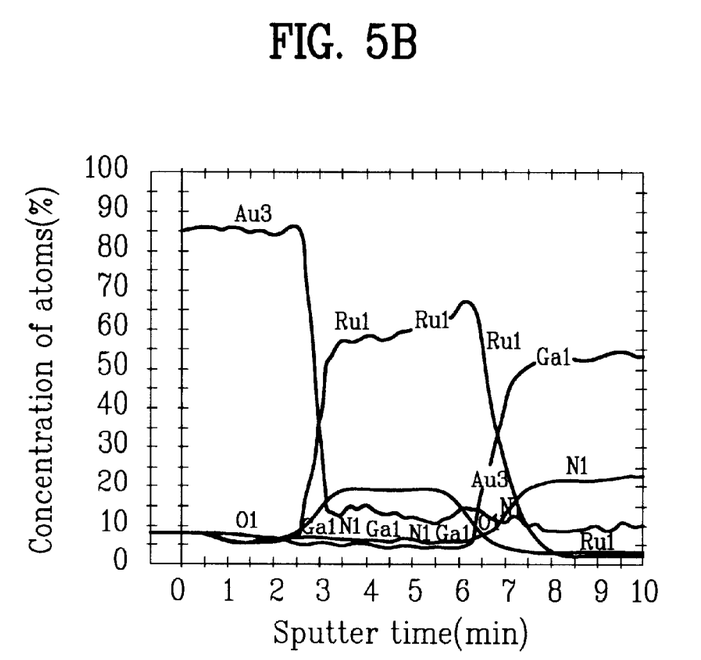

FIGS. 5A and 5B illustrate graphs each showing a result of an AES analysis before and after heat treatment of $RuO_2$ diodes, for analyzing the sharp characteristic improvement.

Referring to FIG. 5A, composition of Ru and O in the ruthenium oxide thin film before the heat treatment is not constant, because the ruthenium oxide thin film sputtering at a room temperature lacks supply of an adequate energy for bonding the Ru and O.

Referring to FIG. 5B, when the ruthenium oxide thin film is heat treated, the oxygen atoms are re-arranged during the heat treatment, to form a constant Ru and O composition through the ruthenium oxide thin film. Moreover, the ruthenium oxide thin film adsorbs oxygen atoms from the interface, to reduce the oxygen present in the interface with the GaN come from the GaN, a natural oxide film, and the oxygen present in the GaN thin film close to the interface impregnated during the MOVCD. The oxygen atom coupled with a hole of Ga in GaN crystal serves as a donor, to cause an ionized impurity concentration $10^{16}/cm^3$ present in a RuO2 interface before the heat treatment obtained at the capacitance-voltage C-V measurement as shown in table 1. Since such undesirable impurities present in the interface of the rectifying junction metal and the semiconductor gives very bad influences to operation of the high frequency, and high powered field effect transistor, removal of the oxygen present in the interface is very important in view of reliability of the device. As shown in FIG. 5B, the reduction of the oxygen concentration shown in a result of the AES measurement is consistent to a reduction of the ionized impurity concentration obtained from the capacitance-voltage C-V measurement shown in table 1. The stabilization of the ruthenium oxide coupling and the reduction of the impurities present in the interface of the rectifying metal and the GaN interface caused by the heat treatment improve characteristics of the rectifying junction.

Figure 6:
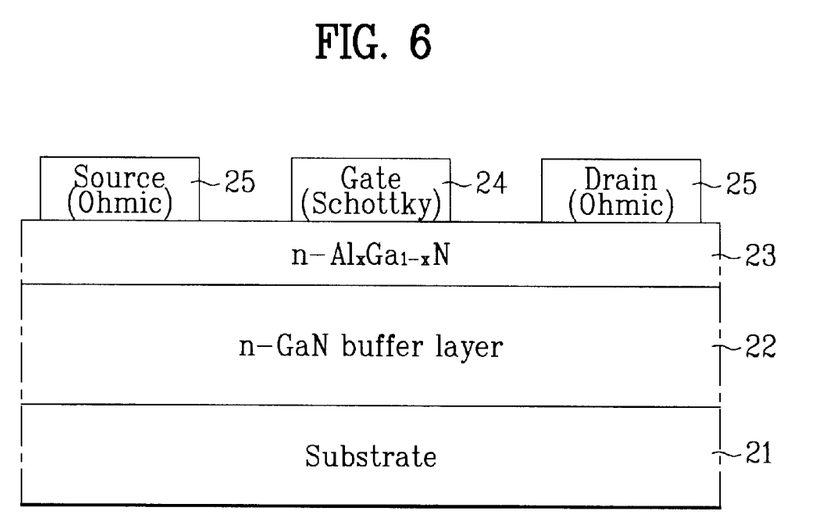
FIG. 6 illustrates a section of a planar type AlGaN/GaN HFET showing an application of a Schottky contact of a ruthenium oxide.

FIG. 6 illustrates a section of a planar type AlGaN/GaN HFET showing an exemplary application of a Schottky contact of a ruthenium oxide.

Referring to FIG. 6, the planar type AlGaN/GaN HFET includes a substrate 21, an n type GaN buffer layer 22 on the substrate 21, an n type $Al_xGa_{1-x}N$ layer 23 on the n type GaN buffer layer 22, at least one metal layer on the n type $Al_xGa_{1-x}N$ layer 23 including a ruthenium component layer formed as a gate 24 with a Schottky contact characteristic, and a source 25 and a drain 25 with an ohmic contact characteristic on the n type $Al_xGa_{1-x}N$ layer 23. The 'x' in the n type $Al_xGa_{1-x}N$ layer 23 ranges $0 \leq x \leq 0.5$, because a value of x>0.5 makes growth of the AlGaN very difficult. The gate 24 in FIG. 6 may be formed of a material selected from Ru, Ru oxide, Au/Ru oxide, Au/Ru, Ru oxide/Ru, Ru/Ru oxide, Au/Ru oxide/Ru and Au/Ru/Ru oxide. The Ru oxide is inclusive of RuO, $RuO_2$, and $RuO_5$. The gate 24 in FIG. 6 may includes a double layer of an upper layer and a lower layer. For an example, the lower layer may be formed of a material selected from $RuO_2$, Ru, $RuO_2$/Ru, and Ru/$RuO_2$, and the upper layer of the gate may be at least one layer of a material selected from Pt, Pd, Ni, Au, Al, W, WSi, Zn, Ta, Ti, Co, and In. As another example, the lower layer may be at least one layer of a material selected from Pt, Pd, Ni, Au, Al, W, WSi, Zn, Ta, Ti, Co, and In, and the upper layer of the gate may be formed of a material selected from $RuO_2$, Ru, $RuO_2$/Ru, and Ru/$RuO_2$. In the lower or upper layer, a thickness of at least one layer of the Pt, Pd, Ni, Au, Al, W, WSi, Zn, Ta, Ti, Co, and In is to be below 200 Å, because characteristics of the at least one layer is suppressed when a thickness of the at least one layer is below 200 Å. Therefore, the characteristics of the ruthenium and the ruthenium oxides are not deteriorated.

Figure 7:
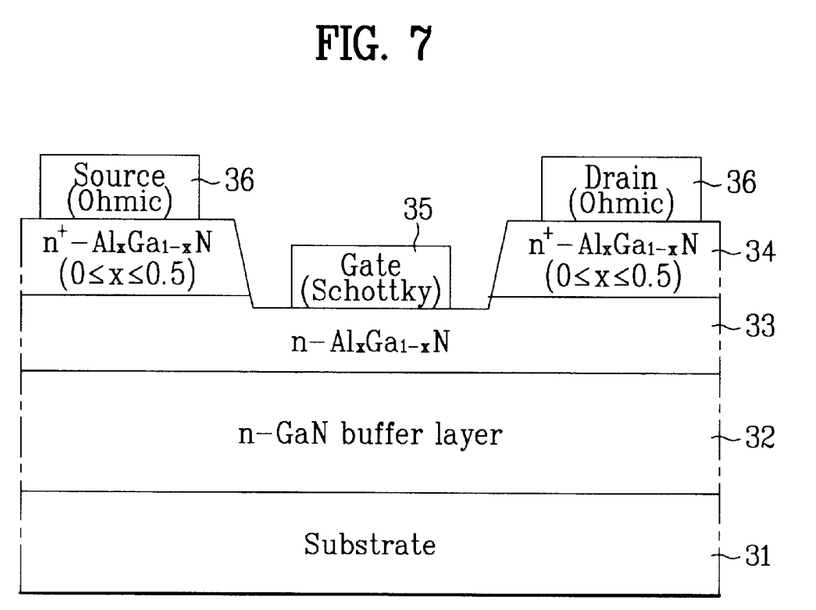
FIG. 7 illustrates a section of a recessed gate type AlGaN/GaN HFET showing an application of a Schottky contact of a ruthenium oxide.

FIG. 7 illustrates a section of a recessed gate type AlGaN/GaN HFET showing an exemplary application of a Schottky contact of a ruthenium oxide, wherein the AlGaN/GaN HFET may be replaced with an InGaN/GaN HFET.

Referring to FIG. 7, the recessed gate type AlGaN/GaN HFET includes a substrate 31, an n type GaN buffer layer 32 on the substrate 31, an n type lightly doped $Al_xGa_{1-x}N$ layer 33 on the n type GaN buffer layer 32, an n type heavily doped $Al_xGa_{1-x}N$ layer 34 with an open region on the n type lightly doped $Al_xGa_{1-x}N$ layer 33, at least one metal layer on the n type lightly doped $Al_xGa_{1-x}N$ layer 33 including a ruthenium component layer formed as a gate 35 with a Schottky contact characteristic in the open region, and source and drain 36 each with an ohmic contact characteristic on the n type heavily doped $Al_xGa_{1-x}N$ layer 34 on both sides of the gate 35. Since the recessed gate type AlGaN/GaN HFET in FIG. 7 has characteristics identical to the planar type AlGaN/GaN HFET in FIG. 6, detailed explanation thereof will be omitted.

Figure 8:
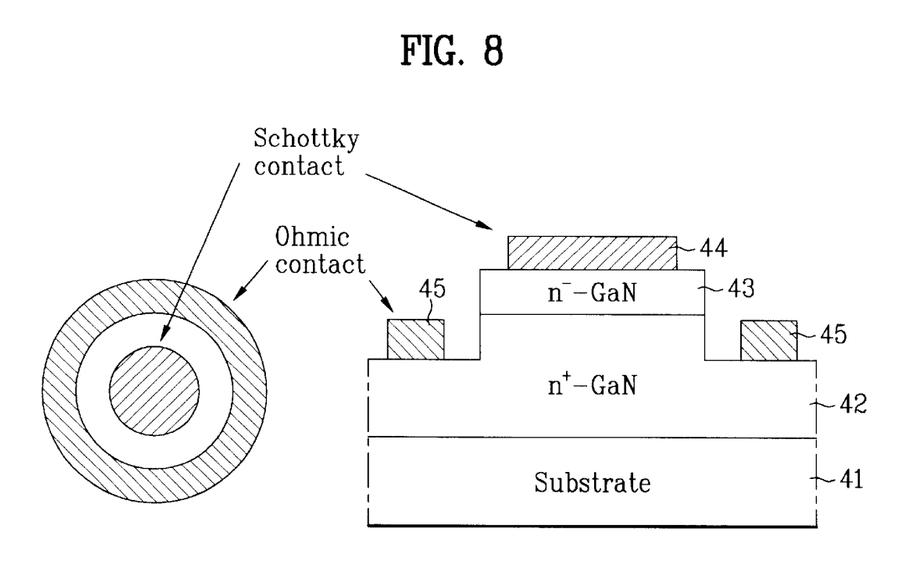
FIG. 8 illustrates a section of a first type Schottky diode showing an application of a Schottky contact of a ruthenium oxide.

FIG. 8 illustrates a section of a first type Schottky diode showing an exemplary application of a Schottky contact of a ruthenium oxide.

Referring to FIG. 8, the first type Schottky diode includes an n type heavily doped GaN layer 42 on a substrate 41 with a projection 42, an n type lightly doped GaN layer 43 on the projection of the n type heavily doped GaN layer 42, at least one metal layer 44 on the n type lightly doped GaN layer 43 including a ruthenium component layer formed as a gate with a Schottky contact characteristic, and source and drain 45 each with an ohmic contact characteristic on the n type heavily doped GaN layer 42 on both sides of the gate 44. Since the first type Schottky diode in FIG. 8 has characteristics identical to the planar type AlGaN/GaN HFET in FIG. 6, detailed explanation thereof will be omitted.

Figure 9:
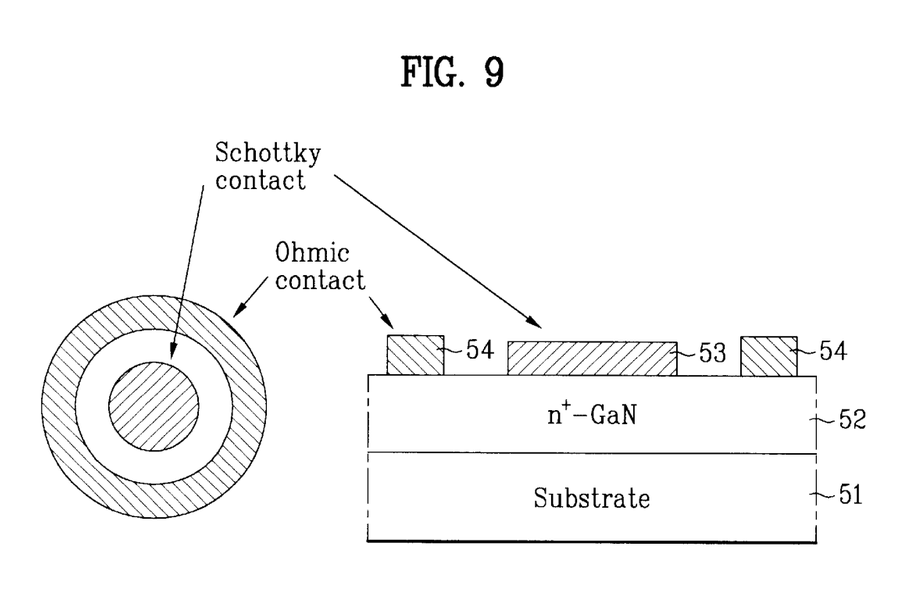
FIG. 9 illustrates a section of a second type Schottky diode showing an application of a Schottky contact of a ruthenium oxide; and, FIG. 10 illustrates a section of an electronic device having an AlGaN/GaN HFET structure of GaN group nitride semiconductor.

FIG. 9 illustrates a section of a second type Schottky diode showing an exemplary application of a Schottky contact of a ruthenium oxide.

Referring to FIG. 9, the second type Schottky diode includes an n type heavily doped ID GaN layer 52 on a substrate 5, at least one metal layer 44 on the n type heavily doped GaN layer 52 including a ruthenium component layer formed as a gate 53 with a Schottky contact characteristic, and source and drain 54 each with an ohmic contact characteristic on the n type heavily doped GaN layer 52 on both sides of the gate 53. Since the second type Schottky diode in FIG. 9 has characteristics identical to the planar type AlGaN/GaN HFET in FIG. 6, detailed explanation thereof will be omitted.

Figure 10:
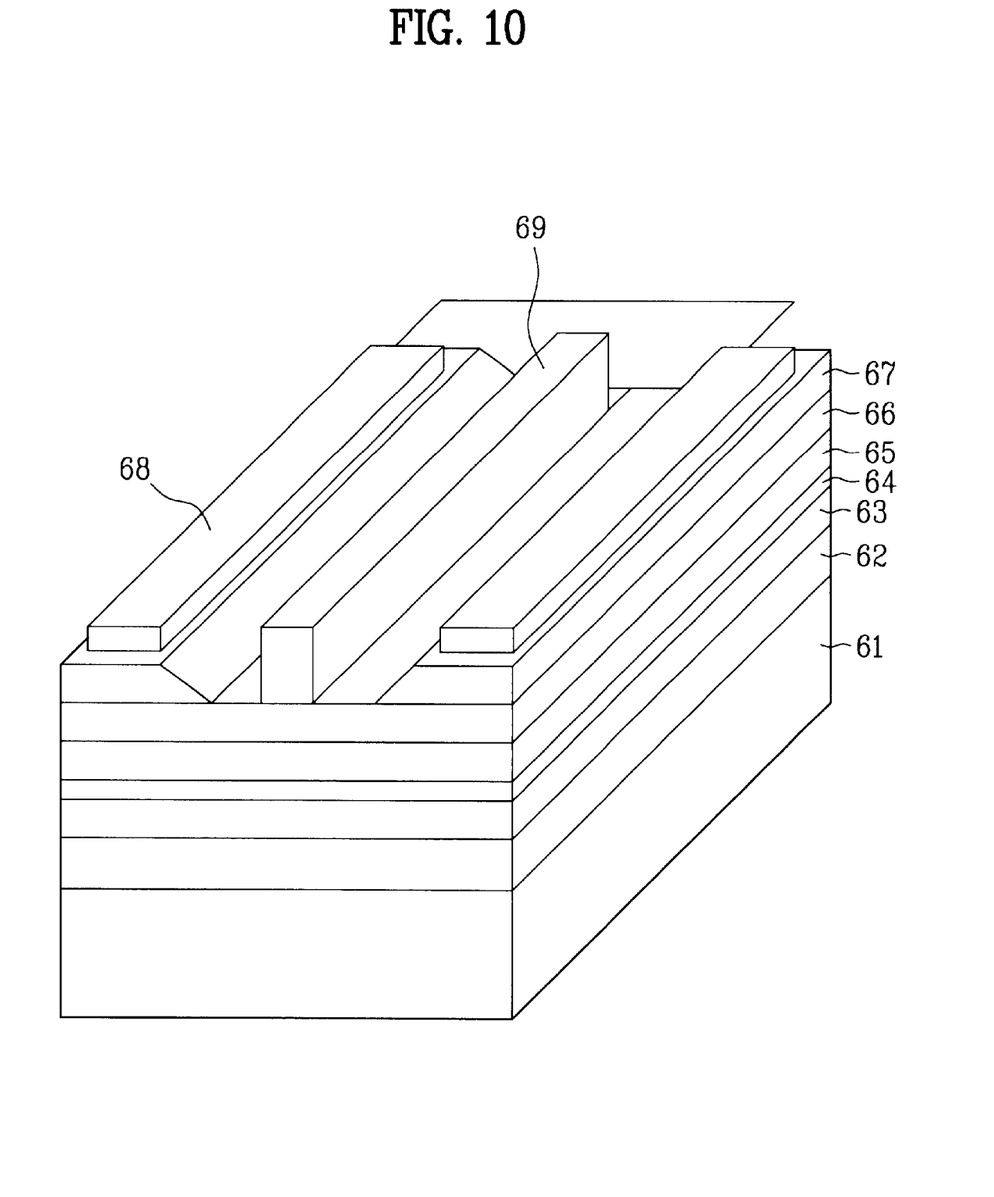

FIG. 10 illustrates a section of an exemplary electronic device having an AlGaN/GaN HFET structure, which is used as a fast switching device, of GaN group nitride semiconductor.

Referring to FIG. 10, at first, an insulated GaN layer 62, an N-GaN 63, an undoped GaN 64, an N-AlGaN 65, an undoped GaN 66 are formed on an $Al_2O_3$ and SiC substrate 61 in succession. Then, a heavily doped $N^+$-GaN 67 is formed and recess etched as a metallization process, to expose a region of the undoped GaN 66. An ohmic contact layer 68 of Al/Ti double layers is formed on an unetched portion of the $N^+$-GaN 67 for an ohmic contact. For forming a good rectifying junction by recess etching down to the undoped GaN 66 thin film, a rectifying junction layer 69 by using a $RuO_2$ electrode is formed as an electrode. The $RuO_2$ electrode is formed by using reactivity. The $N^+$-GaN 67 can not make the rectifying junction, but the ohmic contact, owing to the heavy doping. Therefore, since a gate region, which is the rectifying junction layer 69 by using the $RuO_2$ electrode, has electric characteristics varied with a surface condition of the undoped GaN thin film 66 exposed as the $N^+$-GaN 67 is etched, a surface treatment process is very important. For forming the ohmic contact, the $RuO_2$ electrode of the ohmic contact layer 68 is formed in general by an e-beam evaporator, a thermal evaporator, and sputtering. The $RuO_2$ electrode has electric characteristics varied with a ratio of $Ar/O_2$, a RF power, a working pressure, and thickness formed by using a high purity ruthenium target.

As has been explained, the semiconductor device with a Schottky contact, and method for forming a Schottky contact in a semiconductor device of the present invention have the following advantages.

The use of ruthenium oxide as a rectifying junction metal of a GaN group compound semiconductor, which has a low cost, is stable to heat and chemical, and has excellent electric characteristics, permits operation of a semiconductor device at an elevated temperature, improves performances of an electronic device and UV ray detection.

It will be apparent to those skilled in the art that various modifications and variations can be made in the semiconductor device with a Schottky contact, and the method for forming a Schottky contact in a semiconductor device of the present invention without departing from the spirit or scope of the invention. Thus, it is intended that the present invention cover the modifications and variations of this invention provided they come within the scope of the appended claims and their equivalents.

What is claimed is:

1. A method for forming a Schottky contact in a semiconductor device, comprising:
   (1) preparing an n type GaN group compound semiconductor layer; and,
   (2) forming at least one metal layer including a ruthenium component layer as a rectifying junction metal on the n type GaN group compound semiconductor layer, wherein the rectifying junction metal includes one metal layer selected from the group consisting of Ru and a Ru oxide and wherein the Ru oxide comprises at least one of RuO, $RuO_2$, $RuO_4$, and $RuO_5$.

2. A method as claimed in claim 1, wherein the n type GaN group compound semiconductor layer is selected from the group consisting of n type GaN, n type $Al_xGa_{1-x}N$, and $In_xGa_{1-x}N$, where 'x' is within a range of $0 \leq x \leq 0.5$.

3. A method as claimed in claim 1, wherein the rectifying junction metal comprises at least one of $Au/RuO_2$, Au/Ru, $RuO_2$/Ru, and $Ru/RuO_2$ as double layered metal layer.

4. A method as claimed in claim 1, wherein the rectifying junction metal comprises at least one of $Au/RuO_2$/Ru and $Au/Ru/RuO_2$ as a triple layered metal layer.

5. A method as claimed in claim 1, further comprising heat treating the rectifying junction metal at an elevated temperature ranging 300° C.–600° C. under an ambient of at least one gas selected from oxygen, nitrogen, argon, and air.

6. A method as claimed in claim 1, further comprising heat treating the rectifying junction metal at an elevated temperature ranging 300° C.–600° C. under vacuum.

7. A method as claimed in claim 1, wherein the semiconductor device includes metal semiconductor transistors and Schottky diodes inclusive of AlGaN/GaN HFET.

8. A method for forming a Schottky contact in a semiconductor device, comprising:
   (1) preparing an n type GaN group compound semiconductor layer; and,
   (2) forming a layer of any one material selected from the group consisting of $RuO_2$, Ru, $RuO_2$/Ru, and $Ru/RuO_2$ as a lower layer of a rectifying junction metal on the n type GaN group compound semiconductor layer; and,
   (3) forming at least one layer of material, wherein the at least one layer of material comprises at least one of Pt, Pd, Ni, Au, Al, W, WSi, Zn, Ta, Ti, Co, and In as an upper layer of the rectifying junction metal.

9. A method as claimed in claim 8, further comprising the step of heat treating the rectifying junction metal at an elevated temperature ranging 300° C.–600° C. under an ambient of at least one gas selected from oxygen, nitrogen, argon, and air, or of a vacuum.

10. A method as claimed in claim 8, wherein the semiconductor device includes metal-semiconductor transistors inclusive of $Al_xGa_{1-x}N/GaN$ HFET, and $In_xGa_{1-x}N$ ($0 \leq x \leq 0.5$), and Schottky diodes.

11. A method for forming a Schottky contact in a semiconductor device, comprising:
   (1) preparing an n type GaN group compound semiconductor layer; and,
   (2) forming a layer including at least one material of Pt, Pd, Ni, Au, Al, W, WSi, Zn, Ta, Ti, Co, and In as a lower layer of a rectifying junction metal on the n type GaN group compound semiconductor layer; and,
   (3) forming at least one layer of material selected from the group consisting of $RuO_2$, Ru, $RuO_2/Ru$, and $Ru/RuO_2$ as an upper layer of the rectifying junction metal.

12. A method as claimed in claim 11, further comprising the step of heat treating the rectifying junction metal at an elevated temperature ranging 400° C.–600° C. under an ambient of at least one gas selected from oxygen, nitrogen, argon, and air, or of a vacuum.

13. A method as claimed in claim 11, wherein the semiconductor device includes metal semiconductor transistors and Schottky diodes inclusive of AlGaN/GaN HFET.

14. A method for forming a Schottky contact in a semiconductor device, comprising:
   (1) preparing an n type GaN group compound semiconductor layer; and,
   (2) forming at least one metal layer including a ruthenium component layer as a rectifying junction metal on the n type GaN group compound semiconductor layer, wherein the rectifying junction metal is selected from the group consisting of $Au/RuO_2$, Au/Ru, $RuO_2/Ru$, and $Ru/RuO_2$ as double layered metal layer.

15. A method for forming a Schottky contact in a semiconductor device, comprising:
   (1) preparing an n type GaN group compound semiconductor layer; and,
   (2) forming at least one metal layer including a ruthenium component layer as a rectifying junction metal on the n type GaN group compound semiconductor layer, wherein the rectifying junction metal is selected from the group consisting of $Au/RuO_2/Ru$ and $Au/Ru/RuO_2$ as a triple layered metal layer.

16. A method for forming a Schottky contact in a semiconductor device, comprising:
   (1) preparing an n type GaN group compound semiconductor layer; and,
   (2) forming at least one metal layer including a ruthenium component layer as a rectifying junction metal on the n type GaN group compound semiconductor layer, wherein the rectifying junction metal includes one metal layer selected from the group consisting of Ru and a Ru oxide, and wherein the rectifying junction metal comprises at least one of $Au/RuO_2$, Au/Ru, $RuO_2/Ru$, and $Ru/RuO_2$ as double layered metal layer.

17. A method as claimed in claim 16, wherein the n type GaN group compound semiconductor layer is selected from the group consisting of n type GaN, n type $Al_xGa_{1-x}N$, and $In_xGa_{1-x}N$, where 'x' is within a range of $0 \leq x \leq 0.5$.

18. A method as claimed in claim 16, further comprising heat treating the rectifying junction metal at an elevated temperature ranging 300° C.–600° C. under an ambient of at least one gas selected from oxygen, nitrogen, argon, and air.

19. A method as claimed in claim 16, further comprising heat treating the rectifying junction metal at an elevated temperature ranging 300° C.–600° C. under vacuum.

20. A method as claimed in claim 16, wherein the semiconductor device includes metal semiconductor transistors and Schottky diodes inclusive of AlGaN/GaN HFET.

21. A method for forming a Schottky contact in a semiconductor device, comprising:
   (1) preparing an n type GaN group compound semiconductor layer; and,
   (2) forming at least one metal layer including a ruthenium component layer as a rectifying junction metal on the n type GaN group compound semiconductor layer, wherein the rectifying junction metal includes one metal layer selected from the group consisting of Ru and a Ru oxide, and wherein the rectifying junction metal comprises at least one of $Au/RuO_2/Ru$ and $Au/Ru/RuO_2$ as a triple layered metal layer.

22. A method as claimed in claim 21, wherein the n type GaN group compound semiconductor layer is selected from the group consisting of n type GaN, n type $Al_xGa_{1-x}N$, and $In_xGa_{1-x}N$, where 'x' is within a range of $0 \leq x \leq 0.5$.

23. A method as claimed in claim 21, further comprising heat treating the rectifying junction metal at an elevated temperature ranging 300° C.–600° C. under an ambient of at least one gas selected from oxygen, nitrogen, argon, and air.

24. A method as claimed in claim 21, further comprising heat treating the rectifying junction metal at an elevated temperature ranging 300° C.–600° C. under vacuum.

25. A method as claimed in claim 21, wherein the semiconductor device includes metal semiconductor transistors and Schottky diodes inclusive of AlGaN/GaN HFET.

* * * * *